US008952468B2

(12) United States Patent
Ishimoto et al.

(10) Patent No.: US 8,952,468 B2
(45) Date of Patent: Feb. 10, 2015

(54) ACOUSTIC SENSOR, ACOUSTIC TRANSDUCER, MICROPHONE USING THE ACOUSTIC TRANSDUCER, AND METHOD FOR MANUFACTURING THE ACOUSTIC TRANSDUCER

(75) Inventors: Koichi Ishimoto, Ritto (JP); Yoshitaka Tatara, Yasu (JP); Shin Inuzuka, Konan (JP); Sebastiano Conti, Messina (IT)

(73) Assignees: OMRON Corporation, Kyoto-shi, Kyoto (JP); STMicroelectronics Srl, Agrate Brianza Milan (IT)

( * ) Notice: Subject to any disclaimer, the term of this patent is extended or adjusted under 35 U.S.C. 154(b) by 64 days.

(21) Appl. No.: 13/699,989

(22) PCT Filed: Apr. 20, 2011

(86) PCT No.: PCT/JP2011/059710
§ 371 (c)(1), (2), (4) Date: Nov. 26, 2012

(87) PCT Pub. No.: WO2011/148740
PCT Pub. Date: Dec. 1, 2011

(65) Prior Publication Data

US 2013/0069179 A1 Mar. 21, 2013

(30) Foreign Application Priority Data

May 27, 2010 (JP) ................................ 2010-121681

(51) Int. Cl.
*H01L 29/84* (2006.01)
*H04R 19/00* (2006.01)
*H04R 19/04* (2006.01)

(52) U.S. Cl.
CPC .............. *H04R 19/005* (2013.01); *H04R 19/04* (2013.01); *H04R 2410/03* (2013.01)
USPC .................... 257/416; 257/419; 257/E29.324

(58) Field of Classification Search
CPC ......... H01L 21/02; H01L 29/02; H01L 29/84; H04R 19/005; H04R 2410/03; H04R 19/04
USPC .......... 257/414–420, E29.324, E29.002, 254, 257/E21.002, E31.113; 438/50
See application file for complete search history.

(56) References Cited

U.S. PATENT DOCUMENTS 6,012,335 A * 1/2000 Bashir et al. .................... 73/724
6,441,451 B1 * 8/2002 Ikeda et al. .................. 257/418

(Continued)

FOREIGN PATENT DOCUMENTS

CN 101237719 A 8/2008
EP 1722595 A1 11/2006

(Continued)

OTHER PUBLICATIONS

International Search Report issued in PCT/JP2011/059710 mailed on Jul. 5, 2011 (2 pages).

(Continued)

*Primary Examiner* — Cuong Q Nguyen
*Assistant Examiner* — Yosef Gebreyesus
(74) *Attorney, Agent, or Firm* — Osha Liang LLP

(57) ABSTRACT

In an acoustic sensor, a conductive vibrating membrane and a fixed electrode plate are disposed above a silicon substrate with an air gap provided therebetween, and the substrate has an impurity added to a surface thereof. A microphone includes an acoustic transducer; and an acquiring section that acquires a change in pressure as detected by the acoustic transducer. A method for manufacturing an acoustic transducer including a semiconductor substrate, a vibrating membrane, which is conductive, and a fixed electrode plate and detecting a pressure according to a change in capacitance between the vibrating membrane and the fixed electrode plate, the method includes an impurity adding step of adding an impurity to a surface of the semiconductor substrate; and a forming step of forming the vibrating membrane and the fixed electrode plate above the semiconductor substrate to which the impurity has been added.

5 Claims, 11 Drawing Sheets

(56) References Cited

U.S. PATENT DOCUMENTS

| | | | | |
|---|---|---|---|---|
| 2002/0067663 | A1 | 6/2002 | Loeppert et al. | |
| 2003/0016839 | A1 | 1/2003 | Loeppert et al. | |
| 2004/0259286 | A1 | 12/2004 | Dehe et al. | |
| 2005/0005421 | A1 | 1/2005 | Wang et al. | |
| 2006/0210106 | A1 * | 9/2006 | Pedersen | 381/355 |
| 2007/0058825 | A1 * | 3/2007 | Suzuki et al. | 381/174 |
| 2008/0123878 | A1 * | 5/2008 | Zhe et al. | 381/191 |
| 2010/0065932 | A1 | 3/2010 | Yamaoka et al. | |
| 2010/0132467 | A1 * | 6/2010 | Ko et al. | 73/514.32 |
| 2010/0254561 | A1 | 10/2010 | Kimura et al. | |
| 2011/0042763 | A1 | 2/2011 | Yamaoka et al. | |

FOREIGN PATENT DOCUMENTS

| | | | |
|---|---|---|---|
| JP | 2004-506394 | A | 2/2004 |
| JP | 2007-081614 | A | 3/2007 |
| JP | 2009-231951 | A | 10/2009 |
| JP | 4392466 | B1 | 10/2009 |

OTHER PUBLICATIONS

Written Opinion issued in PCT/JP2011/059710 mailed on Jul. 5, 2011 (3 pages).

Office Action issued in counterpart Chinese Patent Application No. 201180025800.3 dated Jul. 30, 2014 (9 pages).

* cited by examiner (a)

(b)

ACOUSTIC SENSOR, ACOUSTIC TRANSDUCER, MICROPHONE USING THE ACOUSTIC TRANSDUCER, AND METHOD FOR MANUFACTURING THE ACOUSTIC TRANSDUCER

TECHNICAL FIELD

The present invention relates to acoustic transducers and, in particular, to an acoustic transducer with a micro size, which is manufactured by using a MEMS (Micro Electro Mechanical System) technique, to a microphone using the acoustic transducer, and to a method for manufacturing the acoustic transducer.

BACKGROUND ART

Conventionally, a microphone using an acoustic sensor, called an ECM (Electret Condenser Microphone), has been used as a small-sized microphone. However, the ECM is weak against heat, and a microphone (MEMS microphone) using an acoustic sensor manufactured by using a MEMS technique is superior in terms of coping with digitalization, of miniaturization, of enhancement of functionality/multi-functionality, and of power saving. Accordingly, in recent years, the MEMS microphone is being often employed.

The acoustic sensor (MEMS sensor) manufactured by using the MEMS technique is an acoustic sensor fabricated by using a semiconductor integrated circuit fabrication technique. The acoustic sensor includes a diaphragm electrode and a back plate electrode that are provided on a semiconductor substrate so as to form a capacitor.

Then, when a sound pressure is applied to this MEMS sensor, a conductive vibrating membrane (diaphragm) vibrates, and the distance between the vibrating membrane and a fixed membrane (back plate) including a fixed electrode changes. This leads to change in capacitance of the capacitor formed by the vibrating membrane and the fixed electrode. The MEMS microphone measures a change in voltage as caused by this change in capacitance, thereby outputting the sound pressure as an electrical signal. Configurations of MEMS sensors are disclosed in Patent Literatures 1 to 3.

Patent Literature 1 describes a microsensor which uses a silicon substrate as a fixed electrode and which has a vibrating membrane provided on the silicon substrate.

Further, as with Patent Literature 1, Patent Literature 2 describes a silicon condenser microphone (sensor) which uses a silicon substrate as a fixed electrode and which has a vibrating membrane provided on the silicon substrate.

Furthermore, Patent Literature 3 describes an acoustic transducer including: a conductive vibrating plate; and a perforated member isolated from the vibrating plate by an air gap and supported by a substrate.

CITATION LIST

Patent Literature 1

U.S. Patent Application No. 2004/0259286 A (Publication Date: Dec. 23, 2004)

Patent Literature 2

U.S. Patent Application No. 2005/0005421 A (Publication Date: Jan. 13, 2005)

Patent Literature 3

Japanese Translation of PCT International Publication, Tokuhyo, No. 2004-506394 (Publication Date: Feb. 26, 2004)

SUMMARY OF INVENTION

Technical Problem

However, the configurations disclosed in Patent Literatures 1 to 3 raise the following problems. That is, when light strikes the semiconductor substrate constituting the microphone, then due to a photoelectric effect, there occurs a phenomenon in which electrons and holes are generated from atoms and recombined with each other. Then, an electric current is generated in the process of generation and combination of electrons and holes. This electric current becomes noise to make it impossible to accurately output the sound pressure as an electrical signal.

The present invention has been made in view of the above problems, and it is an object of the present invention to achieve an acoustic transducer with a reduction in noise that is generated when light strikes the semiconductor substrate, and the like.

Solution to Problem

In order to solve the above problems, an acoustic transducer according to the present invention includes: a semiconductor substrate; a vibrating membrane, which is conductive; and a fixed electrode plate, the vibrating membrane and the fixed electrode plate being disposed above the semiconductor substrate with an air gap provided therebetween, and the acoustic transducer detecting a pressure according to a change in capacitance between the vibrating membrane and the fixed electrode plate, wherein the semiconductor substrate having an impurity added to a surface thereof.

Further, a method for manufacturing an acoustic transducer according to the present invention is a method for manufacturing an acoustic transducer including a semiconductor substrate, a vibrating membrane, which is conductive, and a fixed electrode plate and detecting a pressure according to a change in capacitance between the vibrating membrane and the fixed electrode plate, the method including: an impurity adding step of adding an impurity to a surface of the semiconductor substrate; and a forming step of forming the vibrating membrane and the fixed electrode plate above the semiconductor substrate to which the impurity has been added.

Incidentally, when light strikes the semiconductor substrate, electrons and holes are generated from atoms due to a photoelectric effect, and then recombined with each other. This causes an electric current to flow through the semiconductor substrate. If the lifetime between the generation of the electrons and the holes due to the photoelectric effect and the recombination of the electrons and the holes with each other is long, then there will be an increase in the number of electrons and holes present. This makes the electric current flowing through the semiconductor substrate larger, so that the noise caused by the electric current becomes bigger.

Meanwhile, if an impurity is added to the semiconductor substrate, the lifetime becomes shorter in the region to which the impurity has been added than in the region to which no impurity has been added. Accordingly, there is a decrease in the number of electrons and holes present. This makes the electric current flowing through the semiconductor substrate smaller, so that the noise caused the current becomes smaller.

Moreover, according to the above configuration or method, the semiconductor substrate has an impurity added to a surface thereof. Hence, even if light strikes the surface of the semiconductor substrate, the lifetime can be shortened, so that the number of electrons and holes present, which are generated due to the photoelectric effect, can be reduced. That is, the electric current that flows can be reduced. This allows a reduction in the noise caused by the electric current generated by the striking of the light, thus making it possible to provide a pressure sensor capable of more accurately detecting a pressure.

Advantageous Effects of Invention

As described above, an acoustic transducer according to the present invention is configured to have an impurity added to a surface thereof.

Further, a method for manufacturing an acoustic transducer according to the present invention is a method including an impurity adding step of adding an impurity to a surface of a semiconductor substrate.

Accordingly, even if light strikes the surface of the semiconductor substrate, the lifetime between the generation of the electrons and the holes due to the photoelectric effect and the recombination of the electrons and the holes with each other can be shortened, so that the number of electrons and holes present, which are generated due to the photoelectric effect, can be reduced. That is, the electric current that flows can be reduced. This allows a reduction in the noise caused by the electric current generated by the striking of the light, thus bringing about an effect of making it possible to provide a pressure sensor capable of more accurately detecting a pressure.

DESCRIPTION OF EMBODIMENTS

An embodiment of the present invention is described below with reference to FIGS. 1 through 11.

(Structure of an Acoustic Sensor)

Figure 1:
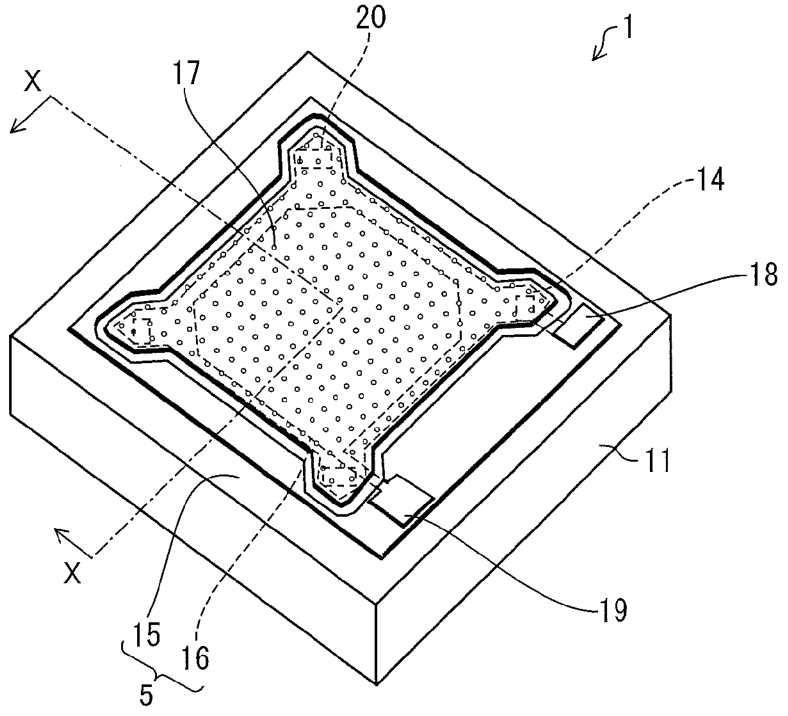
FIG. 1, showing an embodiment of the present invention, is a perspective view showing an external appearance of an acoustic sensor.
Figure 2:
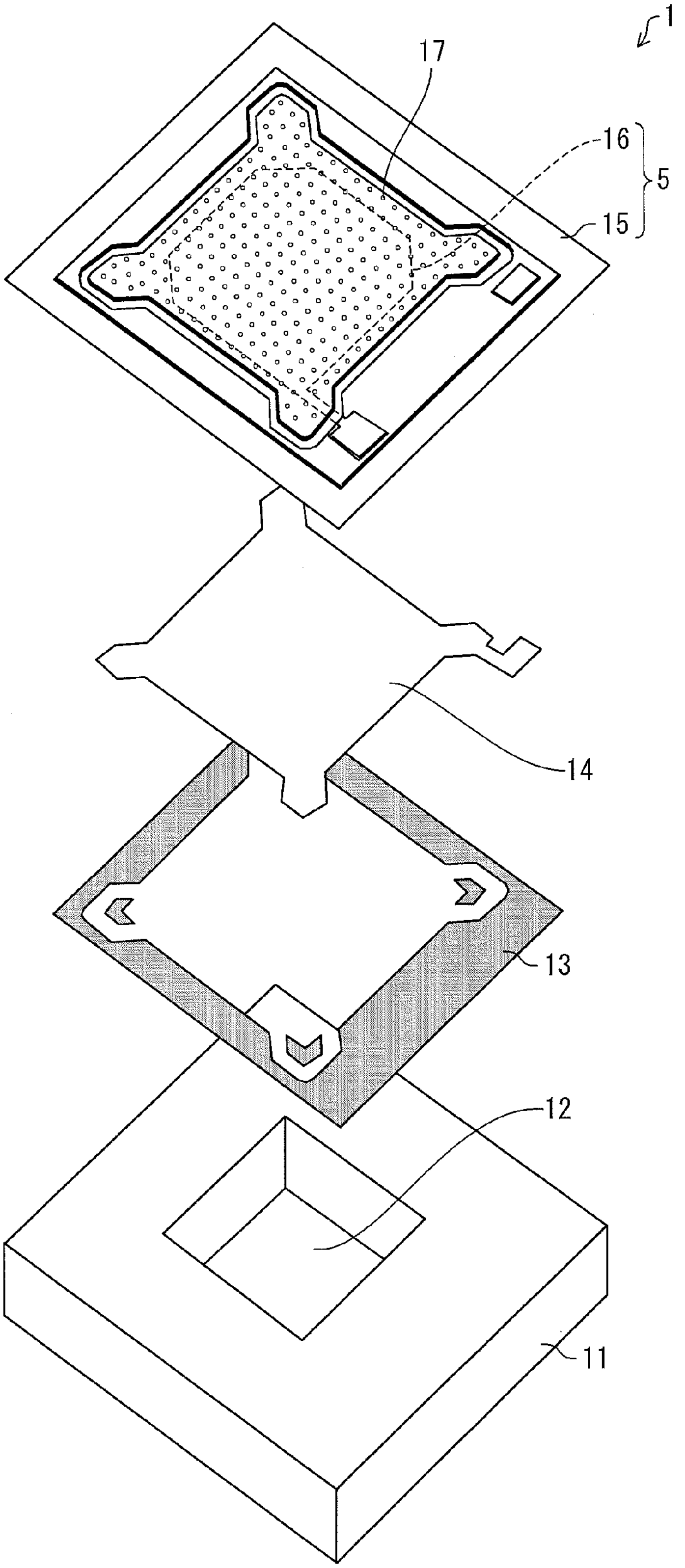
FIG. 2 is an exploded perspective view of the acoustic sensor.
Figure 3:
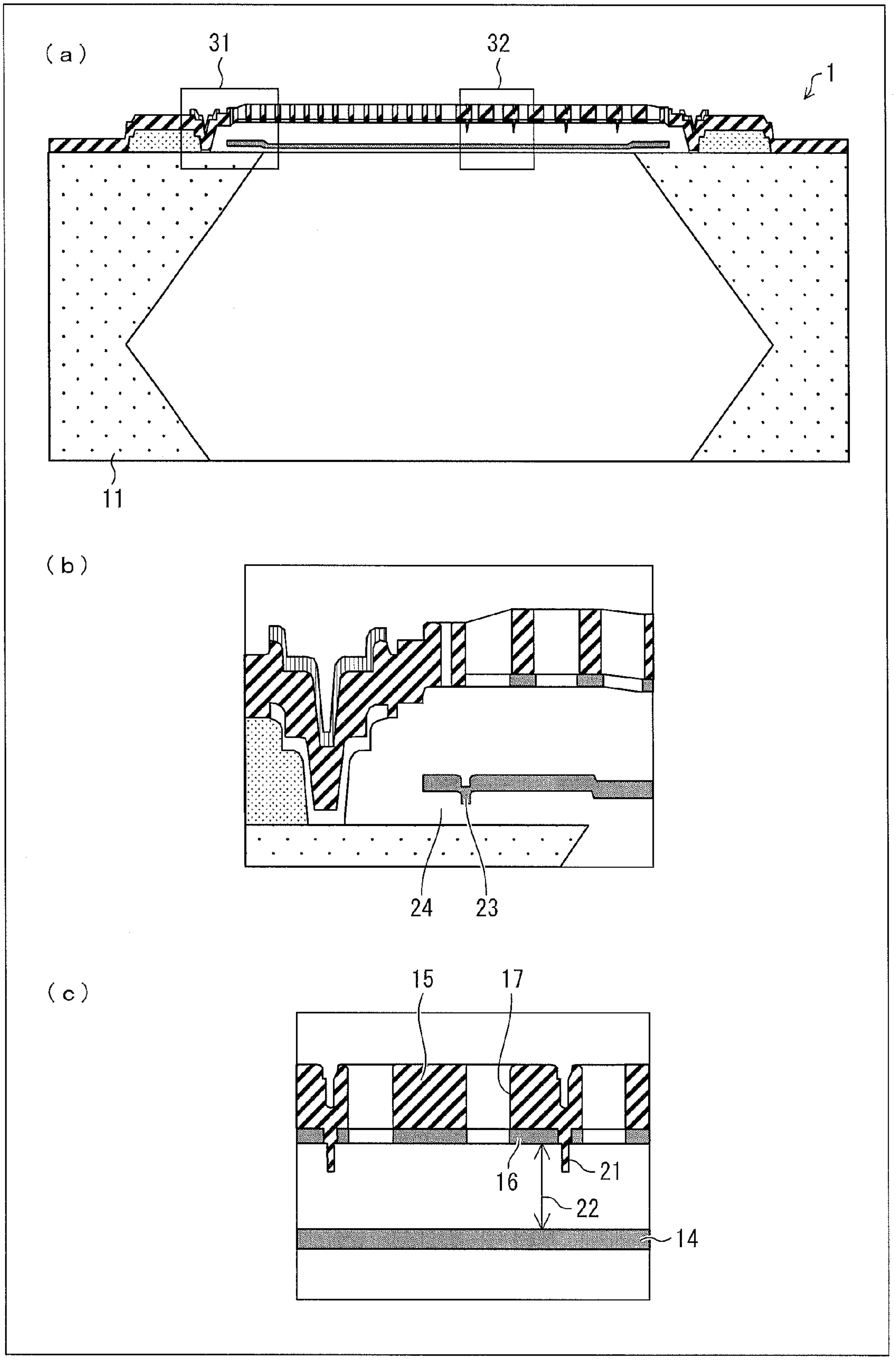
FIG. 3 includes a cross-sectional view of the acoustic sensor as taken along the line X-X of FIG. 1.

First, a structure of an acoustic sensor (acoustic transducer) 1 according to the present embodiment is described with reference to FIGS. 1 through 3. FIG. 1 is a perspective view showing an external appearance of the acoustic sensor 1. Further, FIG. 2 is an exploded perspective view of the acoustic sensor 1. Furthermore, FIG. 3 includes a cross-sectional view of the acoustic sensor 1. (a) of FIG. 3 is an cross-sectional view of the acoustic sensor 1 as taken along the line X-X of FIG. 1. (b) of FIG. 3 is an enlarged view of a region 31 of (a) of FIG. 3, and (c) of FIG. 3 is an enlarged view of a region 32 of (a) of FIG. 3.

As shown in FIGS. 1 and 2, the acoustic sensor 1 includes: a silicon substrate (semiconductor substrate) 11 provided with a through hole serving as a back chamber 12; an insulating membrane 13 stacked on the silicon substrate 11; a vibrating membrane (diaphragm) 14 stacked on the insulating membrane 13; and a fixed electrode plate 5 stacked on the vibrating membrane 14. The fixed electrode plate 5 includes a back plate 15 and a fixed electrode 16, with the fixed electrode 16 disposed on a side of the silicon substrate 11 that faces the back plate 15. Note that the vibrating membrane 14 and the fixed electrode plate 5 may swap their positions with each other.

Moreover, the back plate 15 and the fixed electrode 16 are provided with a plurality of acoustic holes 17. Further, the vibrating membrane 14 has four corners, at one of which a vibrating membrane electrode pad 18 is provided, and the fixed electrode 16 has four corners, at one of which a fixed electrode pad 19 is provided.

Further, as shown in FIG. 3, the vibrating membrane 14 has a stopper 23, and the fixed electrode plate 5 has a stopper 21. Furthermore, provided between the vibrating membrane 14 and the fixed electrode 16 is an air gap (gap) 22 with a dimension of approximately 4 μm.

The silicon substrate 11 is made of monocrystalline silicon, and has a thickness of approximately 500 μm. Further, formed on upper and lower surfaces of the silicon substrate 11 are oxide films serving as insulating films.

The vibrating membrane 14 is made of conductive polycrystalline silicon, and has a thickness of approximately 0.7 μm. The vibrating membrane 14 is a substantially rectangular thin membrane having fixed parts 20 provided at its four corners. Moreover, the vibrating membrane 14 is disposed above the silicon substrate 11 so as to cover the back chamber 12, with only the four fixed parts 20 fixed to the silicon substrate 11, and the vibrating membrane 14 vibrates up and down in response to a sound pressure. Further, one of the fixed parts 20 is provided with the vibrating membrane electrode pad 18.

The back plate 15 is made of a nitride film, and had a thickness of approximately 2 μm. The back plate 15 has its peripheral part fixed to the silicon substrate 11. The back plate 15 and the fixed electrode 16 constitute the fixed electrode plate 5. The fixed electrode 16 is made of polycrystalline silicon, and has a thickness of approximately 0.5 μm. Moreover, the fixed electrode 16 is provided with the fixed electrode pad 19. Furthermore, the back plate 15 and the fixed electrode 16 are provided with the plurality of acoustic holes 17, which serve as holes for allowing a sound pressure to pass therethrough.

Note that the fixed electrode 16 is provided so as to correspond to a vibrating portion of the vibrating membrane 14, which excludes the four corners of the vibrating membrane 14. This is because the four corners of the vibrating membrane 14 are fixed, and even if the fixed electrode 16 is provided at places corresponding to these four corners, there is no change in capacitance between the vibrating membrane 14 and the fixed electrode 16.

The acoustic holes 17 cause a sound pressure to be applied not to the fixed electrode plate 5, but to the vibrating membrane 14. Further, the provision of the acoustic holes 17 allows air in the air gap 22 to be easily dissipated to the outside, thus reducing thermal noise and therefore enabling a reduction in noise.

Moreover, the vibrating membrane 14 and the fixed electrode plate 5 are provided with the stopper 23 and the stopper 21, respectively. The stopper 23 prevents the vibrating membrane 14 from adhering (sticking) to the silicon substrate 11 at parts other than the fixed parts 20, and the stopper 21 prevents the vibrating membrane 14 and the fixed electrode plate 5 from adhering to each other. As for the size of each stopper, the stopper 23 has a length of approximately 0.3 μm, and the stopper 21 has a length of approximately 1.0 μm.

Because of the aforementioned structure, when the acoustic sensor 1 receives a sound pressure via its surface, the fixed electrode plate 5 does not move but the vibrating membrane 14 vibrates. This causes a change in distance between the vibrating membrane 14 and the fixed electrode 16 and accordingly, causes a change in capacitance between the vibrating membrane 14 and the fixed electrode 16. Hence, the sound pressure can be detected as an electrical signal by applying a DC voltage in advance between the vibrating membrane electrode pad 18 electrically connected to the vibrating membrane 14 and the fixed electrode pad 19 electrically connected to the fixed electrode 16 and extracting the change in capacitance as the electrical signal.

(Configuration of a Microphone)

Figure 4:
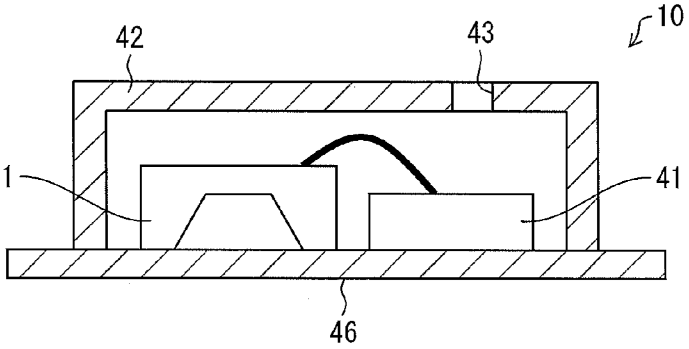
FIG. 4 is a set of diagrams (a) and (b) each showing a configuration of a main part of a microphone including the acoustic sensor.
Figure 4:
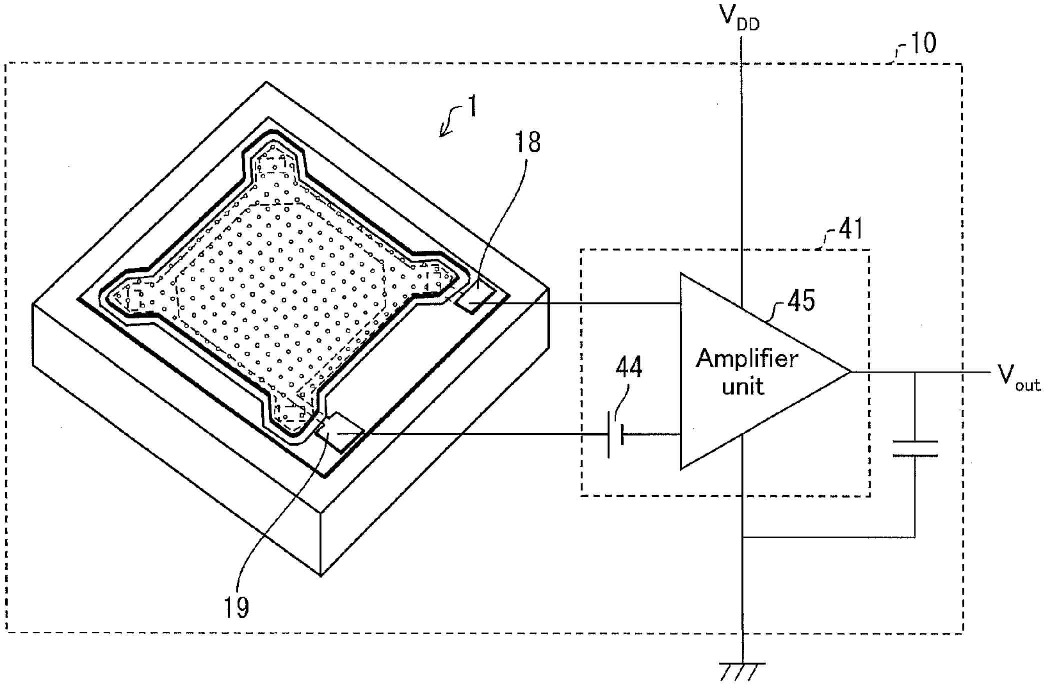

A configuration of a microphone 10 according to the present embodiment is described with reference to FIG. 4. FIG. 4 is a set of diagrams (a) and (b) each showing a configuration of a main part of the microphone 10. (a) of FIG. 4 is a diagram schematically showing an external appearance of the microphone 10, and (b) of FIG. 4 is a block diagram of the microphone 10.

As shown in (a) of FIG. 4, the microphone 10 has a configuration in which the acoustic sensor 1 and an ASIC (Application Specific Integrated Circuits, acquiring section) 41 are connected to each other, are disposed on a printed board 46, and are surrounded by a case 42. Further, the case 42 is provided with a hole 43. Moreover, an external sound pressure passing through the hole 43 and reaching the acoustic sensor 1 is detected by the acoustic sensor 1. Further, there is a possibility that noise due to light may be generated by external light passing through the hole 43 and reaching the acoustic sensor 1.

Further, as shown in (b) of FIG. 4, the ASIC 41 includes a charge pump 44 and an amplifier unit 45. Then, the vibrating membrane electrode pad 18 and the fixed electrode pad 19 of the acoustic sensor 1 are connected to the ASIC 41.

The charge pump 44 is a DC power supply, and applies a DC voltage between the vibrating membrane electrode pad 18 and the fixed electrode pad 19 of the acoustic sensor 1. That is, the aforementioned DC voltage for use in detection of a change in capacitance between the vibrating membrane 14 and the fixed electrode 16 is applied by the charge pump 44.

The amplifier unit 45 measures a voltage between the vibrating membrane electrode pad 18 and the fixed electrode pad 19 of the acoustic sensor 1, and outputs a variation of the voltage. That is, this output indicates a change in capacitance between the vibrating membrane 14 and the fixed electrode 16 in the form of an electrical signal, thus enabling detection of a sound pressure. Note that $V_{DD}$ denotes a power supply voltage and $V_{OUT}$ denotes an output voltage.

(Addition of an Impurity)

Figure 5:
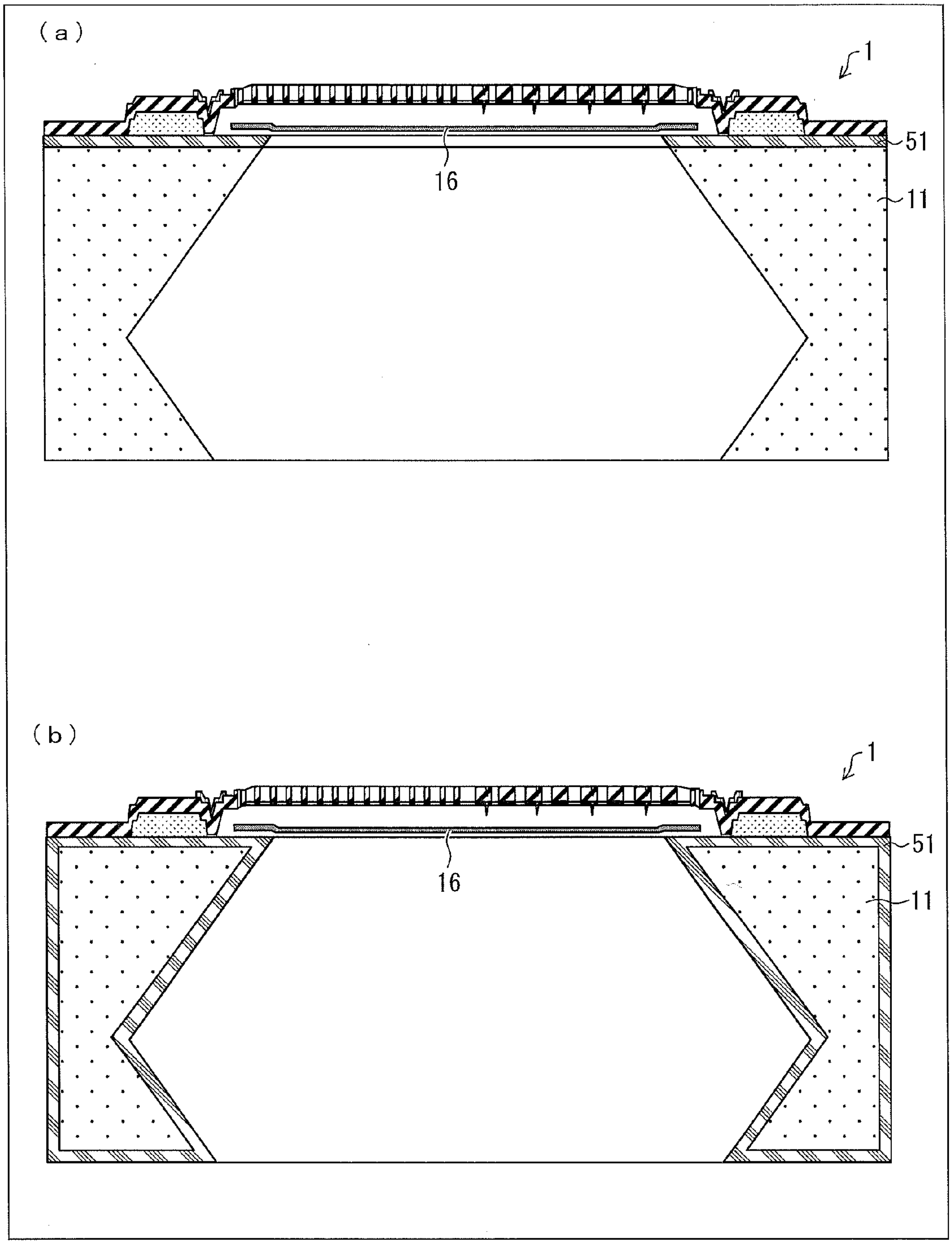
FIG. 5 is a set of diagrams (a) and (b) each showing a region in a silicon substrate of the acoustic sensor to which an impurity is added.
Figure 6:
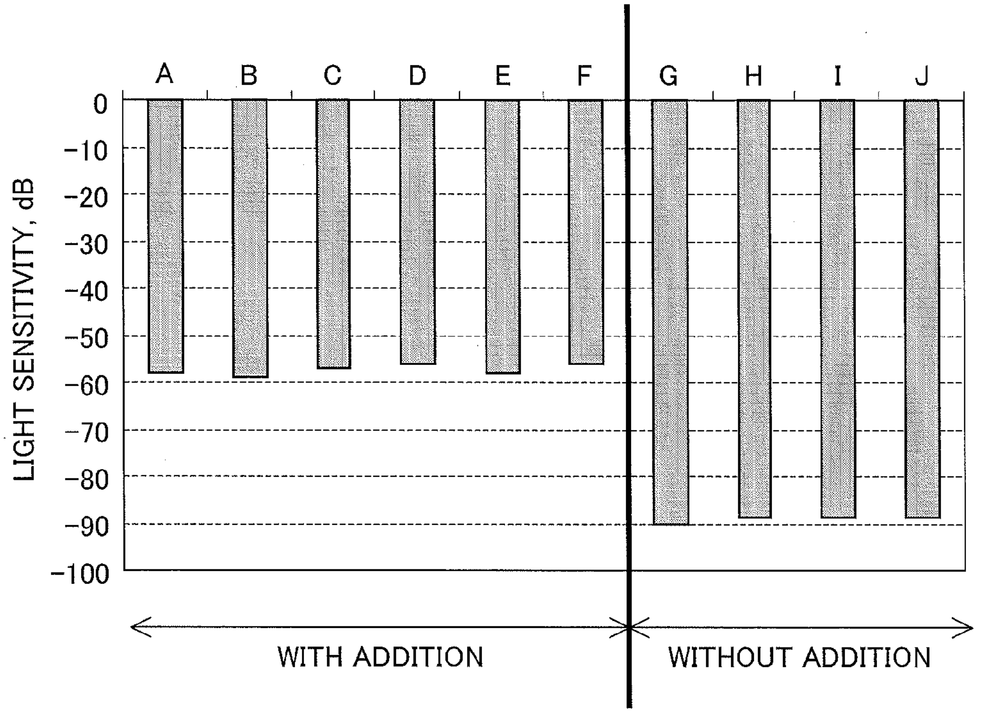
FIG. 6 is a diagram for explaining an effect that is brought about by the addition of an impurity.
Figure 7:
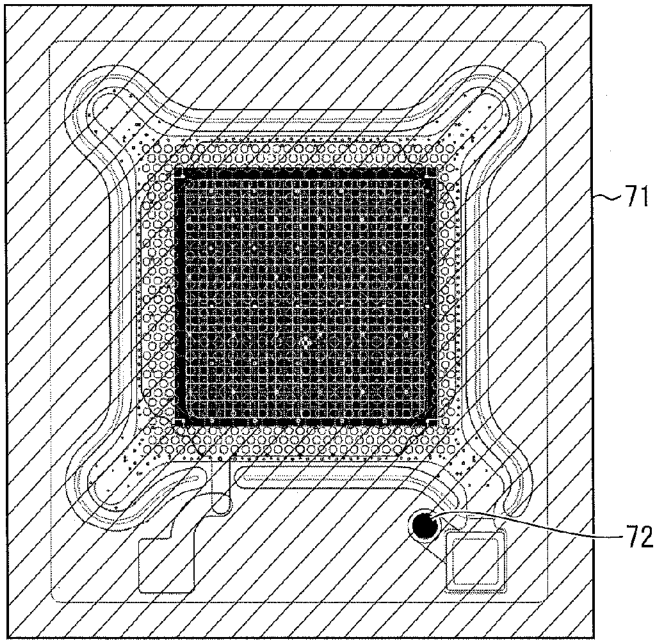
FIG. 7 is a diagram for explaining a difference in impurity concentration in a region to which an impurity is added.

Next, the addition of an impurity is described with reference to FIGS. 5 through 7. FIG. 5 is a set of diagrams (a) and (b) each showing a region to which an impurity is added. FIG. 6 is a diagram for explaining an effect that is brought about by the addition of an impurity. FIG. 7 is a diagram for explaining a difference in impurity concentration a region to which an impurity is added.

In the present embodiment, the silicon substrate 11 has a surface to which an impurity has been added. The addition of an impurity is performed by ion doping. First, a reason for the addition of an impurity is given.

When light strikes the silicon substrate 11 of the acoustic sensor 1, then atoms of the silicon substrate 11 are excited by the light, so that electrons and holes are generated (photoelectric effect). Then, an electric current is generated until the generated electrons and holes are combined with each other (light noise). The electric current thus generated flows through the vibrating membrane electrode pad 18 and the fixed electrode pad 19, thus causing an error in the DC voltage to be extracted by the ASIC 41.

In this connection, the addition of an impurity to the surface of the silicon substrate 11 brings about the following effects. That is, the time until the electrons and the holes, which are generated by the light striking the silicon substrate 11, are combined with each other is shortened. Hence, the time during which the electric current generated by the photoelectric effect flows is shortened. Accordingly, the current flowing through the vibrating membrane electrode pad 18 and the fixed electrode pad 19 can be reduced, and the error in the DC voltage to be extracted by the ASIC 41 can be reduced.

Regions to which impurities are added are described with reference to FIG. 5. In the present embodiment, the silicon substrate 11 has an impurity-added region 51 to which an impurity has been added, and the impurity-added region 51 is a surface of the silicon substrate 11 above which the vibrating membrane 14, the fixed electrode plate 5, and the like are stacked. This makes it possible to reduce light noise that is generated by incoming light having passed through the acoustic holes 17 and striking the surface of the silicon substrate 11.

Note that the region to which an impurity is added is not limited this. For example, as shown in (b) of FIG. 5, the impurity may be added to the entire surface of the silicon substrate 11. This makes it possible to reduce light noise that is generated by light having entered the case 42 of the microphone 10.

Examples of the impurity to be added to the silicon substrate 11 include boron (B), phosphorus (P), arsenic (As), gold (Au), aluminum (Al), iron (Fe), chromium (Cr), and compounds thereof.

Next, FIG. 6 shows results of light sensitivity measurement as obtained by irradiating silicon substrates 11 to which an impurity has been added and silicon substrates 11 to which no impurity has been added. In this case, the impurity used is boron.

In FIG. 6, the vertical axis represents light sensitivity, and shows that light noise is less likely to be generated as it goes downward. Among the silicon substrates 11 shown in FIG. 6, the substrates A to F have no impurity added thereto, and the substrates G to F have an impurity added thereto. FIG. 6 shows that the substrates G to J, which have an impurity added thereto, are lower in light sensitivity, i.e., less likely to suffer from light noise than the substrates A to F, which have no impurity added thereto.

Next, the concentration of an impurity to be added is described with reference to FIG. 7. FIG. 7 is a top view of the silicon substrate 11. The region 71, indicated by hatching, is high in concentration, and the region 72 is low in concentration. The region 72 is a part where the vibrating membrane electrode pad 18 and the silicon substrate 11 are electrically connected to each other, and an increase in electrical resistance can be achieved by lowering the concentration of the impurity in this part. This makes it possible to keep resistance between chips when manufacturing a plurality of chips (acoustic sensors 1) on a single wafer (substrate) and perform electrical measurement of the plurality of chips simultaneously.

Figure 8:
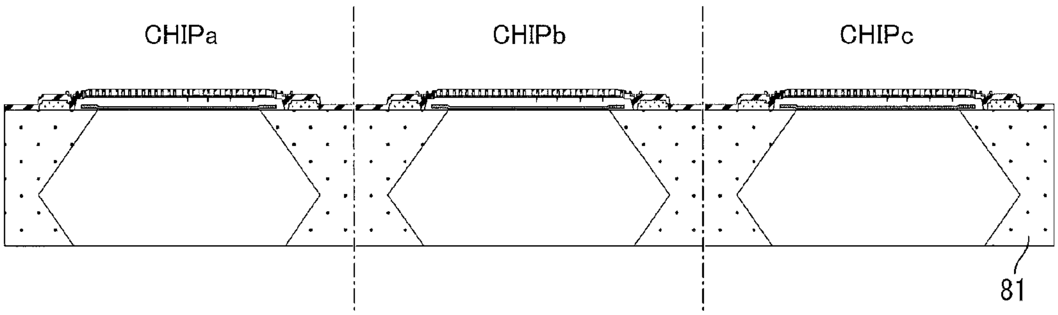
FIG. 8 is a diagram showing a state in which a plurality of chips are manufactured on a single wafer.
Figure 9:
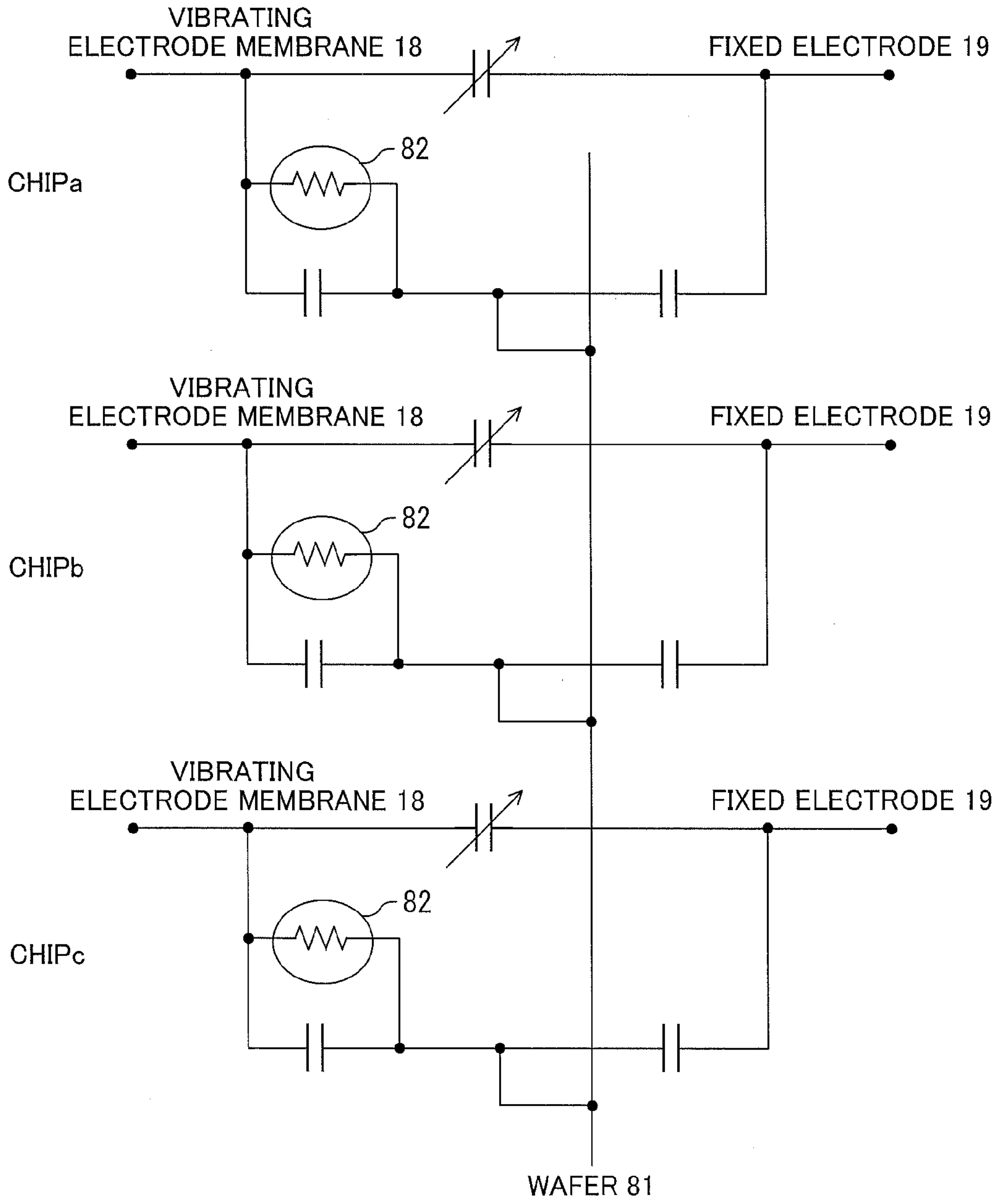
FIG. 9 is a diagram showing an electrical connection relationship among a plurality of chips that are manufactured on a single wafer.

The ability to perform electrical measurement of the plurality of chips simultaneously is described in more detail with reference to FIGS. 8 and 9. FIG. 8 is a diagram showing a state in which a plurality of chips are manufactured on a single wafer. Moreover, FIG. 9 is a diagram showing an electrical connection relationship among the plurality of chips.

As shown in FIG. 8, a plurality of chips (chip a, chip b, chip c) are manufactured on a single wafer 81. An electrical connection relationship at this time is as shown in FIG. 9. It should be noted here that in a case where the value of resistance of resistors 82 between the vibrating membrane electrodes pads 18 and the wafer 81 is low the vibrating membrane electrode pads 18 of all of the chips are brought into a short-circuited state. Hence, when the electrical measurement of the plurality of chips is simultaneously performed in this state, accurate measurement results are not obtained for the respective chips. Meanwhile, if the value of resistance of the resistors 82 is high, the vibrating membrane electrode pads 18 of all of the chips are not brought into a short-circuited state. Then, the electrical measurement of the plurality of chips can be simultaneously performed.

Further, the vibrating membrane 14 and the silicon substrate 11 are short-circuited with each other so that the acoustic sensor 1 can be prevented from being destroyed in a case where the vibrating membrane 14 and the fixed electrode 15 are short-circuited with each other. Note that the vibrating membrane 14 and the silicon substrate 11 are not short-circuited with each other, but instead the fixed electrode 16 and the silicon substrate 11 may be short-circuited with each other.

Next, a state of connection between the vibrating membrane 14 and the silicon substrate 11 is described with reference to FIG. 10. (b) of FIG. 10 is a cross-sectional view taken along the line Y-Y in (a) of FIG. 10.

Figure 10:
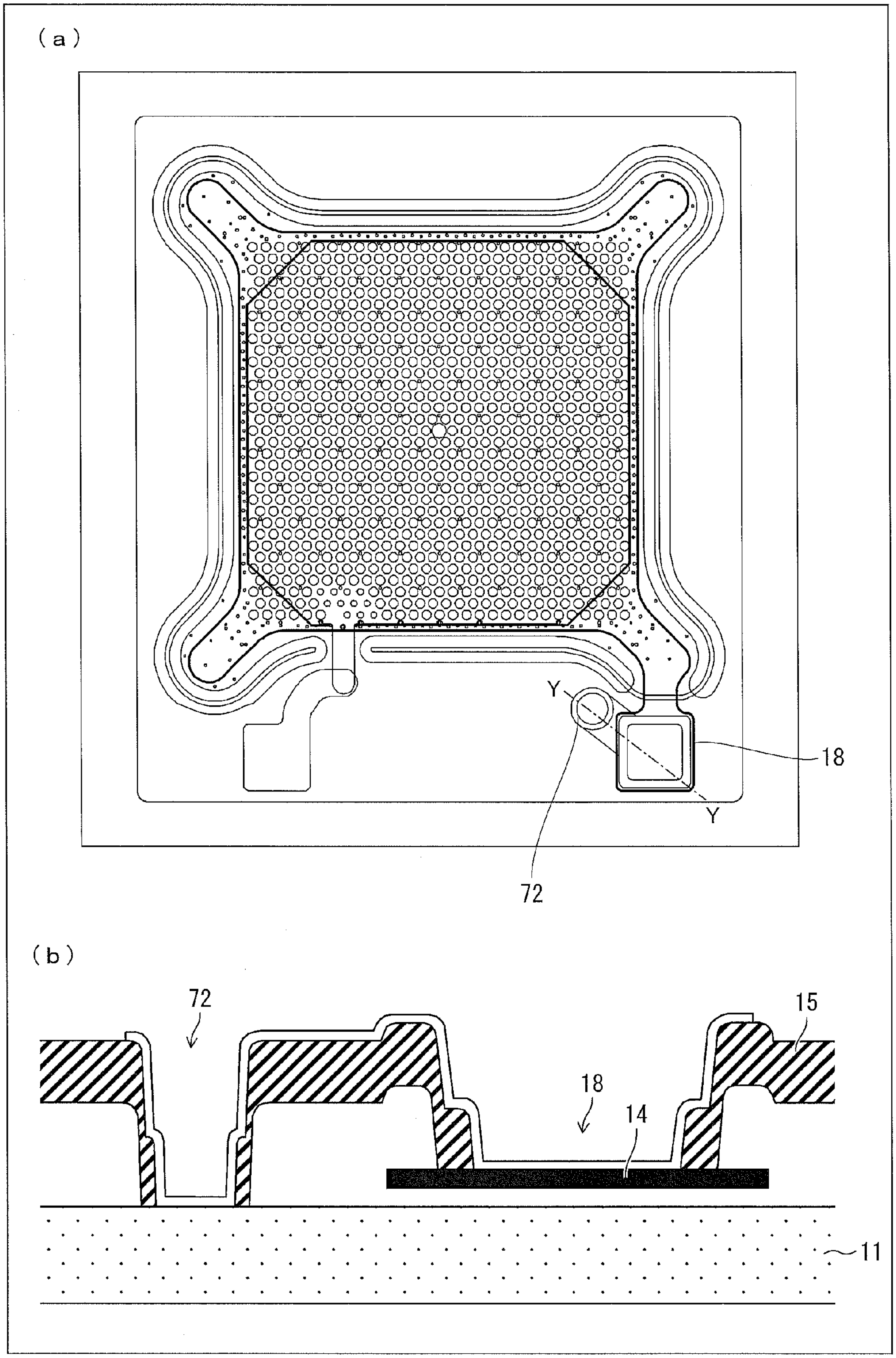
FIG. 10 is a set of explanatory diagrams (a) and (b) showing a state of connection between the silicon substrate and a vibrating membrane in the acoustic sensor.

As mentioned above, the vibrating membrane 14 and the silicon substrate 11 are connected to each other in the region 72 of (a) of FIG. 10. More specifically, as shown in (b) of FIG. 10, the vibrating membrane electrode pad 18 and the vibrating membrane 14 are connected to each other. Moreover, on the fixed electrode plate 15, the vibrating membrane electrode pad 18 is electrically connected to the region 72, and in the region 72, the vibrating membrane electrode pad 18 is connected to the silicon substrate 11.

(Process for Manufacturing an Acoustic Sensor)

Figure 11:
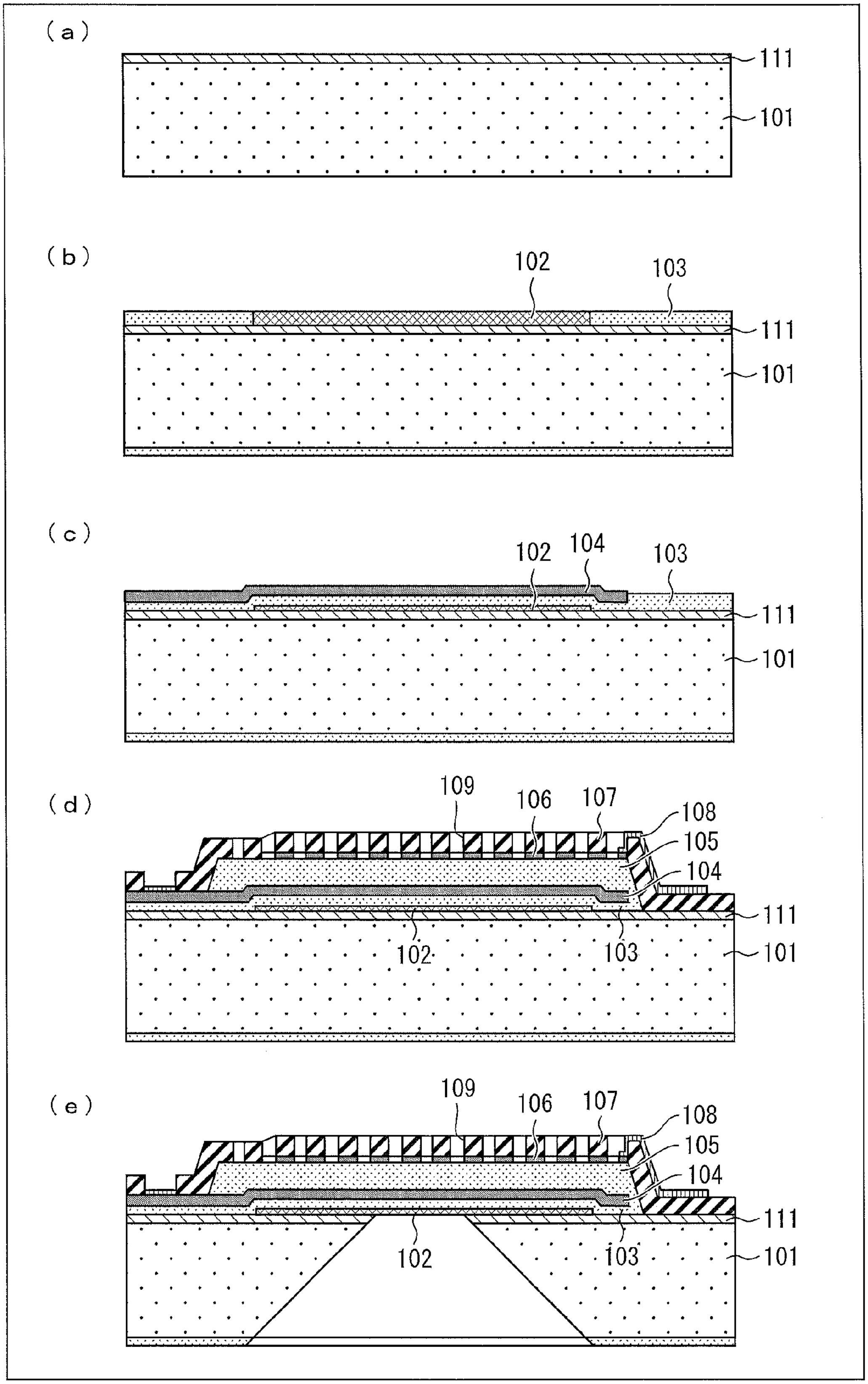
FIG. 11 is a set of explanatory diagrams (a) to (c) showing steps of a process for manufacturing the acoustic sensor.
Figure 12:
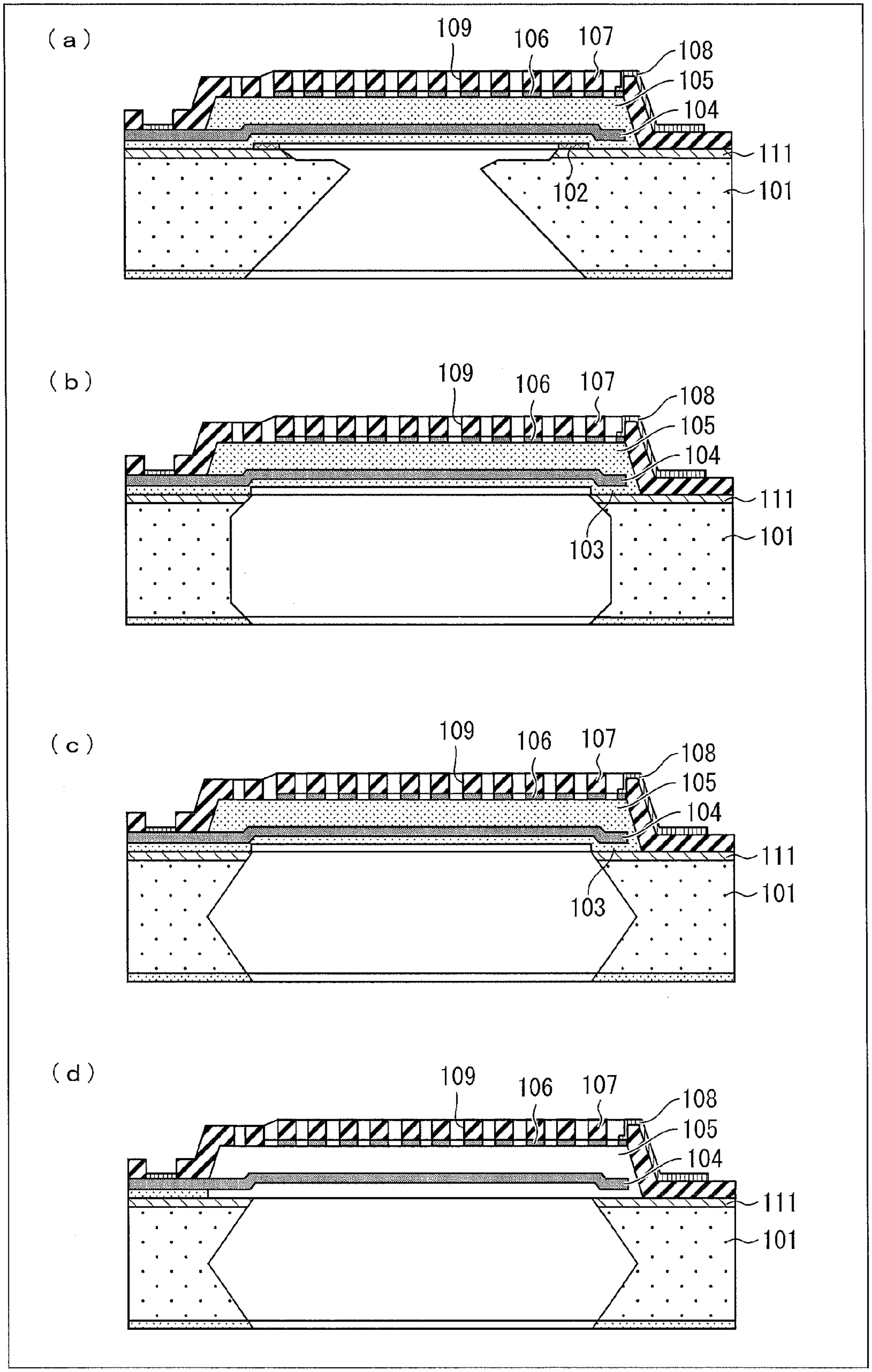
FIG. 12 is a set of explanatory diagrams (a) to (d) showing steps of the process for manufacturing the acoustic sensor.

Next, steps of a process for manufacturing the acoustic sensor 1 are described with reference to FIGS. 11 and 12. FIGS. 11 and 12 are explanatory diagrams showing steps of the process for manufacturing the acoustic sensor 1.

First, as shown in (a) of FIG. 11, a surface of a silicon substrate 101 is oxidized by a thermal oxidation method, so as to be covered with an insulating coating film ($SiO_2$ film). Then, an impurity is added to an impurity-added region 111 by ion doping (impurity adding step). Next, as shown in (b) of FIG. 11, a sacrifice layer (polycrystalline silicon) 102 and a sacrifice layer (silicon oxide) 103 are deposited on the impurity-added region 111 to which the impurity has been added (forming step). Then, as shown in (c) of FIG. 11, a vibrating membrane (polycrystalline silicon) 104 is formed on an upper surface of the sacrifice layer 103 (forming step).

Next, as shown in (d) of FIG. 11, a sacrifice layer (silicon oxide) 105 is deposited on the vibrating membrane 104 thus formed (forming step), and furthermore, a fixed electrode 106 is formed by forming a metal thin film on the sacrifice layer 105, and a back plate 107 is formed by deposition silicon nitride (insulating layer) on the fixed electrode 106 (forming step). Then, an electrode pad 18 is formed by forming a film of gold or in a predetermined position, and a hole 109 is formed in the fixed electrode 106 and the back plate 107.

After that, as shown in (e) of FIG. 11, the silicon substrate 101 is etched by anisotropic etching.

Next, as shown in (a) of FIG. 12, the sacrifice layer 102 is etched by isotropic etching. Furthermore, as shown in (b) of FIG. 12, an upper-surface side of the silicon substrate 101 is etched. Then, as shown in (c) of FIG. 12, the etching of the silicon substrate 101 is completed, and finally, as shown in (d) FIG. 12, the sacrifice layer 103 and the sacrifice layer 105 are etched. In this manner, the acoustic sensor 1 is completed.

(Others)

As described above, an acoustic transducer according to the present invention includes: a semiconductor substrate; a vibrating membrane, which is conductive; and a fixed electrode plate, the vibrating membrane and the fixed electrode plate being disposed above the semiconductor substrate with an air gap provided therebetween, the acoustic transducer detecting a pressure according to a change in capacitance between the vibrating membrane and the fixed electrode plate, the semiconductor substrate having an impurity added to a surface thereof.

Further, a method for manufacturing an acoustic transducer according to the present invention is a method for manufacturing an acoustic transducer including a semiconductor substrate, a vibrating membrane, which is conductive, and a fixed electrode plate and detecting a pressure according to a change in capacitance between the vibrating membrane and the fixed electrode plate, the method including: an impurity adding step of adding an impurity to a surface of the semiconductor substrate; and a forming step of forming the vibrating membrane and the fixed electrode plate above the semiconductor substrate to which the impurity has been added.

Incidentally, when light strikes the semiconductor substrate, electrons and holes are generated from atoms due to a photoelectric effect and then recombined with each other. This causes an electric current to flow through the semiconductor substrate. If the lifetime between the generation of the electrons and the holes due to the photoelectric effect and the recombination of the electrons and the holes with each other is long, then there will be an increase in the number of electrons and holes present. This makes the electric current flowing through the semiconductor substrate larger, so that the noise caused by the electric current becomes bigger.

Meanwhile, if an impurity is added to the semiconductor substrate, the lifetime becomes shorter in the region to which the impurity has been added than in the region to which no impurity has been added. Accordingly, there is a decrease in the number of electrons and holes present. This makes the electric current flowing through the semiconductor substrate smaller, and the noise caused by the electric current becomes smaller.

Moreover, according to the above configuration or method, the semiconductor substrate has an impurity added to a surface thereof. Hence, even if light strikes the surface of the semiconductor substrate, the lifetime can be shortened, so that the number of electrons and holes present, which are generated due to the photoelectric effect, can be reduced. That is, the electric current that flows can be reduced. This allows a reduction in the noise caused by the electric current generated by the striking of the light, thus making it possible to provide a pressure sensor is capable of more accurately detecting a pressure.

The acoustic transducer according to the present invention is preferably configured such that the semiconductor substrate has the impurity added to a surface thereof that faces the vibrating membrane formed.

On the side on which the vibrating membrane is formed, the vibrating membrane and the fixed electrode plate are formed. Moreover, in the case of detecting a pressure by detecting, as an electrical signal, a change in capacitance between the vibrating membrane and the fixed electrode plate, an electric current flowing toward the side of the semiconductor substrate that faces the vibrating membrane formed exerts a great influence on the electrical signal. That is, when light strikes the side of the semiconductor substrate that faces the vibrating membrane formed, the generated electric current causes noise that exerts a great influence.

The above configuration makes it possible to reduce the electric current to be generated by light striking the side of the semiconductor substrate that faces the vibrating membrane formed, thus making it possible to more accurately detect a pressure.

The acoustic transducer according to the present invention may be configured such that the surface of the semiconductor substrate may be electrically connected to the vibrating membrane or the fixed electrode plate.

With the above configuration, even if the surface of the semiconductor substrate are brought into contact and electrically short-circuited with the vibrating membrane or the fixed electrode plate for some reason while a voltage is being applied between the vibrating membrane and the fixed electrode plate, an electric current flows from the vibrating membrane or the fixed electrode plate to the semiconductor substrate. Accordingly, the destruction of the device due to the short circuit can be avoided.

Incidentally, in the case of acoustic transducers respectively formed in a plurality regions on a single semiconductor substrate by forming a vibrating membrane and a fixed electrode plate in each region, an electrical connection between the surface of the semiconductor substrate and either the vibrating membranes or the fixed electrode plates makes it difficult to simultaneously perform electrical measurement of the plurality of acoustic transducers. The reason for this is as follows: The vibrating membrane or the fixed electrode plate of a first acoustic transducer is electrically connected to the vibrating membrane or the fixed electrode plate of a second acoustic transducer, and an electrical measurement of the first acoustic transducer and an electrical measurement of the second acoustic transducer affect each other.

Accordingly, the acoustic transducer according to the present invention may be configured such that within the surface of the semiconductor substrate to which the impurity has been added, the region electrically connected to the vibrating membrane or the fixed electrode is lower in impurity concentration than other regions.

A region with a low impurity concentration impedes passage of an electric current in comparison with a region with a high impurity concentration. That is, a region with a low impurity concentration has a higher value of resistance than a region with a high impurity concentration Hence, according to the above configuration, the region where the semiconductor substrate and either the vibrating membrane or the fixed electrode plate is electrically connected to each other has a high value of resistance.

Accordingly in the process of manufacturing the device, with acoustic transducers respectively formed in a plurality of regions on a single semiconductor substrate by forming a vibrating membrane and a fixed electrode plate in each region, electrical measurements of the plurality of acoustic transducers can be performed simultaneously.

Note that it is preferable that the impurity shorten the lifetime by being added to the semiconductor substrate, and for example, it is preferable that the impurity be boron, phosphorus, arsenic, gold, aluminum, iron, chromium, or a compound thereof.

The aforementioned effects can be brought about even by a microphone including the acoustic transducer and an acquiring section that acquires a change in pressure as detected by the acoustic transducer.

The present invention is not limited to the description of the embodiment above, but may be altered in various ways within the scope of the claims. An embodiment based on a proper combination of technical means appropriately altered within the scope of the claims is also encompassed in the technical scope of the present invention.

INDUSTRIAL APPLICABILITY

A small-sized acoustic sensor capable of more accurately detecting a sound pressure can be achieved. Such an acoustic sensor is suitable, for example, to a microphone of a cellular phone.

REFERENCE SIGNS

1 Acoustic sensor (acoustic transducer)
5 Fixed electrode plate
10 Microphone
11 Silicon substrate (semiconductor substrate)
12 Back chamber
13 Insulating film
14 Vibrating membrane
15 Back plate
16 Fixed electrode
17 Acoustic hole
18 Vibrating membrane electrode pad
19 Fixed electrode pad
20 Fixed part
21, 23 Stopper
22 Air gap (gap)
41 ASIC (acquiring section)
101 Silicon substrate
102, 103, 105 Sacrifice layer
104 Vibrating membrane
106 Fixed electrode
107 Back plate
108 Electrode pad
109 Hole
111 Impurity-added region

The invention claimed is:

1. An acoustic transducer comprising:
a semiconductor substrate;
a vibrating membrane, which is conductive; and
a fixed electrode plate,
wherein the vibrating membrane and the fixed electrode plate are disposed above the semiconductor substrate with an air gap provided therebetween, and wherein said acoustic transducer detects a pressure according to a change in capacitance between the vibrating membrane and the fixed electrode plate, and wherein a surface of the semiconductor substrate comprises an added impurity, and wherein a first portion of the surface which is electrically connected to the vibrating membrane or the fixed electrode plate has a lower impurity concentration than a second portion of the surface, and wherein the first portion and the second portion are on the same side.

2. The acoustic transducer according to claim 1, wherein the first portion faces the vibrating membrane.

3. The acoustic transducer according to claim 1, wherein the impurity is comprises boron, phosphorus, arsenic, gold, aluminum, iron, chromium, or a compound thereof.

4. A microphone comprising:

the acoustic transducer according to claim 1; and an acquiring section that acquires a change in pressure as detected by the acoustic transducer.

5. A method for manufacturing an acoustic transducer including a semiconductor substrate, a vibrating membrane, which is conductive, and a fixed electrode plate and detecting a pressure according to a change in capacitance between the vibrating membrane and the fixed electrode plate, said method comprising:

an impurity adding step of adding an impurity to a surface of the semiconductor substrate; and a forming step of forming the vibrating membrane and the fixed electrode plate above the semiconductor substrate to which the impurity has been added, and wherein a first portion of the surface which is electrically connected to the vibrating membrane or the fixed electrode plate has a lower impurity concentration than a second portion of the surface, and wherein the first portion and the second portion are on the same side.

* * * * *